United States Patent
Kobayashi et al.

(10) Patent No.: US 9,478,414 B2
(45) Date of Patent: Oct. 25, 2016

(54) METHOD FOR HYDROPHOBIZATION OF SURFACE OF SILICON-CONTAINING FILM BY ALD

(71) Applicant: ASM IP Holding B.V., Almere (NL)

(72) Inventors: Akiko Kobayashi, Tokyo (JP); Akinori Nakano, Tokyo (JP); Dai Ishikawa, Ome (JP); Kiyohiro Matsushita, Fuchu (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/498,036

(22) Filed: Sep. 26, 2014

(65) Prior Publication Data

US 2016/0093485 A1 Mar. 31, 2016

(51) Int. Cl.
*H01L 21/02* (2006.01)
*H01L 21/3105* (2006.01)

(52) U.S. Cl.
CPC ....... *H01L 21/0228* (2013.01); *H01L 21/0234* (2013.01); *H01L 21/02126* (2013.01); *H01L 21/02164* (2013.01); *H01L 21/02274* (2013.01); *H01L 21/02359* (2013.01); *H01L 21/02362* (2013.01); *H01L 21/3105* (2013.01)

(58) Field of Classification Search
CPC .................. H01L 2924/0002; H01L 21/3105; H01L 2924/00; H01L 21/76814; H01L 21/76826; H01L 21/02203; H01L 21/02126
See application file for complete search history.

(56) References Cited

U.S. PATENT DOCUMENTS

| | | | |
|---|---|---|---|
| 6,445,574 B1 | 9/2002 | Saw et al. | |
| 7,135,402 B2 | 11/2006 | Lin et al. | |
| 7,851,232 B2 | 12/2010 | Schravendijk et al. | |
| 7,998,875 B2 | 8/2011 | DeYoung | |
| 8,445,075 B2 | 5/2013 | Xu et al. | |
| 8,492,170 B2 | 7/2013 | Xie et al. | |
| 8,535,767 B1 | 9/2013 | Kimura | |
| 2006/0105566 A1 | 5/2006 | Waldfried et al. | |
| 2006/0172531 A1 | 8/2006 | Lin et al. | |
| 2007/0066079 A1 | 3/2007 | Kloster et al. | |
| 2007/0082132 A1* | 4/2007 | Shinriki ............. | C23C 16/0245 427/255.394 |
| 2011/0159202 A1 | 6/2011 | Matsushita et al. | |
| 2012/0263876 A1 | 10/2012 | Haukka et al. | |
| 2013/0295779 A1 | 11/2013 | Chandra et al. | |
| 2013/0337583 A1 | 12/2013 | Kobayashi et al. | |

OTHER PUBLICATIONS

Article by Akiko Kobayshi, Naoto Tsuji, Atsuki Fukazawa and Nobuyoshi Kobayashi, entitled "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, (2012), pp. 3994-3998.

* cited by examiner

*Primary Examiner* — Tony Tran
(74) *Attorney, Agent, or Firm* — Snell & Wilmer LLP

(57) ABSTRACT

A method is for hydrophobization of a surface of a silicon-containing film by atomic layer deposition (ALD), wherein the surface is subjected to atmospheric exposure. The method includes: (i) providing a substrate with a silicon-containing film formed thereon; and (ii) forming on a surface of the silicon-containing film a hydrophobic atomic layer as a protective layer subjected to atmospheric exposure, by exposing the surface to a silicon-containing treating gas without exciting the gas. The treating gas is capable of being chemisorbed on the surface to form a hydrophobic atomic layer thereon.

6 Claims, 3 Drawing Sheets

METHOD FOR HYDROPHOBIZATION OF SURFACE OF SILICON-CONTAINING FILM BY ALD

BACKGROUND

1. Field of the Invention

The present invention generally relates to a method for repairing process-related damage of a dielectric film by cyclic processes, particularly to a method for hydrophobization of a surface of a silicon-containing film by atomic layer deposition (ALD).

2. Description of the Related Art

Dielectric films are indispensable to increasing processing speed of semiconductor devices and lowering power consumption of the devices. Dielectric films are susceptible to damage during their manufacturing processes, thereby increasing dielectric constants and/or leakage currents. Such process-related damage includes damage caused by dry etching and plasma ashing, and washing with chemicals, and physical damage by chemical mechanical planarization (CMP), etc. Particularly, in advanced devices, dielectric films are porous and have low dielectric constant values. Such porous low-k films are highly susceptible to damage during an etching process for patterning or the like, and when the films are damaged, the dielectric constant values increase. In order to recover the dielectric constant values, restoration of the damaged porous surface is necessary. Further, before depositing a barrier metal or the like, pores of the porous surface must be sealed for inhibiting diffusion of the barrier metal. Thus, after the patterning of the dielectric film but before deposition of a barrier metal thereon, restoration and pore-sealing are necessary.

In order to repair such process-related damage of the dielectric films, U.S. Pat. No. 7,851,232 and U.S. Patent Application Publication No. 2011/0159202, for example, disclose repairing damage by UV-excited reaction using a gas containing carbon. However, although damaged surfaces can be restored to a certain degree by the above methods using a hydrocarbon film, restoration is insufficient depending on the degree of damage. Further, a hydrocarbon film can seal pores of the damaged surfaces, but the hydrocarbon film does not have sufficient barrier function as a pore-sealing film against a barrier metal although it can inhibit diffusion of chemicals such as toluene to a certain degree.

Further, a surface of a pore-sealing film or other a silicon-containing film is often subjected to atmospheric exposure, and moisture adsorption occurs on the surface and moisture is diffused through the pore-sealing film and reaches an underlying film such as a low-k film, increasing a dielectric constant of the low-k film.

Any discussion of problems and solutions involved in the related art has been included in this disclosure solely for the purposes of providing a context for the present invention, and should not be taken as an admission that any or all of the discussion were known at the time the invention was made.

SUMMARY

In some embodiments of the present invention which can solve at least one of the above-addressed problems, in a method where a SiO or SiOC film is deposited on a low-k film by atomic layer deposition (ALD) using a silylation compound, a material which is capable of rendering a surface of the SiO or SiOC film hydrophobic when the material is adsorbed onto the surface is introduced to the surface by ALD using a silicon-containing material as a last step of the deposition treatment.

In some embodiments, the silicon-containing material has a single Si—N bond and at least one Si—CxHy bond or Si—H bond in its molecule. In some embodiments, the silicon-containing material is selected from the group consisting of dimethylaminotrimethylsilane (DMATMS), isopropylaminotrimethylsilane, dimethylaminotrimethylsilane, dimethylaminotriethylsilane, 2-picolylaminotrimethylsilane, hexamethyldisilazane (HMDS), and tetramethyldisilazane (TMDS).

In some embodiments, the silicon-containing material is the same material used for depositing the SiO or SiOC film.

In some embodiments, the SiO or SiOC film is a pore-sealing film formed by plasma-enhanced atomic layer deposition (PEALD). In some embodiments, the PEALD comprises cycles, each cycle comprising supplying an ALD material, purging the material, and applying RF power. In some embodiments, when applying RF power, oxygen-containing gas such as $O_2$, $NO_2$, and/or $CO_2$ is introduced for generating a plasma. In some embodiments, RF power is applied at 100 W or less for 3 seconds or less for a 300-mm wafer.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

Figure 1:
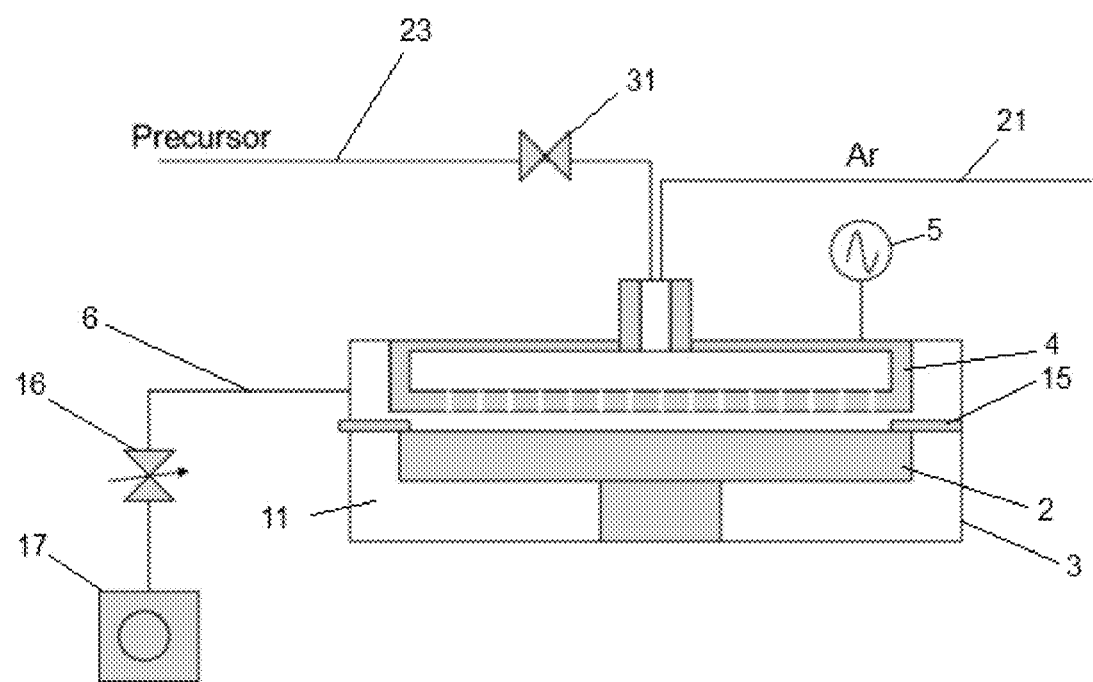
FIG. 1 is a schematic representation of a PEALD apparatus for depositing a pore-sealing film on a dielectric film usable in an embodiment of the present invention.

In this disclosure, "gas" may include vaporized solid and/or liquid and may be constituted by a single gas or a mixture of gases. In this disclosure, "film" may refer to a fixed layer (fixed by using, e.g., active species) which continuously extends in a direction perpendicular to a thickness direction and can grow or can accumulate in the thickness direction beyond a thickness of one atomic layer, "layer" may refer to a structure having a certain thickness formed on a surface, and "monolayer" may refer to a layer having a thickness of substantially or nearly one atomic layer or a layer formed by chemical saturation adsorption which may be constituted partially by more than one atomic layer. In some embodiments, a "monolayer" may be formed by a step of adsorption of a precursor on a surface in one cycle of atomic layer deposition (ALD), and the monolayer may not be a film but may be converted or fixed to a monolayer film by a step of surface reaction with reactive species created by, e.g., a plasma or heat. For example, a "monolayer", a plurality of which constitute a pore-sealing film or the like, is a self-assembled layer of molecules having a molecular size of, for example, about 0.1 nm to about 0.3 nm, which molecules are adsorbed in pores with a pore size of, for example, 1 to 3 nm of a damaged low-k film and aligned along with OH group terminals present in the pores. Also, for example, a "monolayer" constituting a hydrophobic atomic layer formed on a pore-sealing film or the like is a self-assembled layer of molecules having a molecular size of, for example, about 0.1 nm to about 0.3 nm, which molecules are adsorbed on a surface of the pore-sealing film or the like and aligned along with OH group terminals present in the surface. A film may be constituted by a discrete single film having certain characteristics or multiple films, and a boundary between adjacent films may or may not be clear and may be established based on physical, chemical, and/or any other characteristics, formation processes or sequence, and/or functions or purposes of the adjacent films. The term "constituted by" refers to "comprising", "consisting essentially of", or "consisting of" in some embodiments.

In this disclosure, the thickness of a film or layer refers to an average thickness of the film or layer as measured when a film or layer is formed under the same process conditions on a flat surface, which average thickness is determined by measuring a thickness of the film or layer at randomly selected multiple points of the film or layer. In this disclosure, an article "a" or "an" refers to a species or a genus including multiple species. Further, in this disclosure, any two numbers of a variable can constitute a workable range of the variable as the workable range can be determined based on routine work, and any ranges indicated may include or exclude the endpoints. Additionally, any values of variables indicated may refer to precise values or approximate values and include equivalents, and may refer to average, median, representative, majority, etc. in some embodiments. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation. In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

Some embodiments of the present invention provide a method for hydrophobization of a surface of a silicon-containing film by atomic layer deposition (ALD), said surface being subjected to atmospheric exposure, said method comprising: (i) providing a substrate with a silicon-containing film formed thereon; and (ii) forming on a surface of the silicon-containing film a hydrophobic atomic layer as a protective layer subjected to atmospheric exposure, by exposing the surface to a silicon-containing treating gas without exciting the gas, said treating gas being capable of being chemisorbed on the surface to form a hydrophobic atomic layer thereon. Since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby per cycle. "Chemisorption" refers to chemical saturation adsorption which is a kind of adsorption which involves a chemical reaction between the surface and the adsorbate, without exciting the adsorbate. In some embodiments, the "hydrophobic atomic layer" is a monolayer which obtains hydrophobic property through the chemisorption process. By forming the hydrophobic atomic layer as a protective layer on the surface of the silicon-containing film, the surface can effectively be protected from moisture, inhibiting moisture diffusion through the film and inhibiting an increase of OH groups in an underlying film such as a low-k film. As a result of inhibiting an increase of OH groups, an increase of dielectric constant of the low-k film can effectively be inhibited.

In some embodiments, the hydrophobic atomic layer is formed by chemical saturation adsorption, wherein the thickness of the layer is equivalent to a thickness of one atomic layer constituted by molecules of the treating gas or more but is less than about 1.0 nm, typically less than about 0.5 nm, e.g., about 0.1 nm to about 0.3 nm. In some embodiments, the hydrophobic atomic layer has a contact angle against water of about 80° or higher.

The k-value (dielectric constant) of a low-k film increases when the number of OH groups present in pores of the low-k film increases in the film. When a pore-sealing film is deposited on the low-k film by ALD and closes the pores, as a first step, a material for the pore-sealing film is adsorbed at adsorption sites present on a surface of the low-k film. For example, when an aminosilane material is used, an amine group thereof undergoes substitution reaction with an OH group, chemisorbing the aminosilane material on the surface of the low-k film. The chemisorbed material becomes hydrophilic as a result of reaction between the chemisorbed material and an oxidizing gas, forming a SiO film on the low-k film. Thus, the resultant SiO film formed on the low-k film by ALD has a hydrophilic surface, and when the surface is exposed to the atmosphere, moisture is adsorbed on the surface and diffused through the SiO film, increasing OH groups in the low-k film and thus increasing the k-value. However, by treating the surface of the pore-sealing film using a material which is capable of rendering its surface hydrophobic, as a last step added to the ALD process of the pore-sealing film (e.g., breaking a vacuum after the last step), a hydrophobic atomic layer is formed on the surface of the pore-sealing film, and moisture adsorption from the surface of the pore-sealing film can effectively be inhibited. Further, additionally, by using a material which is capable of rendering a surface of a low-k film hydrophobic when a pore-sealing film is deposited by ALD, not only the surface of the low-k film but also the inside pores which are exposed to the material can be hydrophobic.

Additionally, a pore-sealing film formed by PEALD and constituted by SiO has at least the following advantages as compared with a pore-sealing film formed by PEALD and constituted by SiCN or the like. First, the SiO pore-sealing film has an excellent conformality, e.g., about 85% or higher or about 90% or higher, and has an excellent GPC (growth rate per cycle), e.g., about 0.06 nm/cycle or higher or about 0.1 nm/cycle or higher. Further, in some embodiments, a SiO pore-sealing film can be formed using a suitable precursor without using a catalyst such as a B- or Zr-based catalyst.

In some embodiments, the material for the hydrophobic atomic layer and the material for the pore-sealing film are the same, and the step of forming the pore-sealing film and the step of forming the hydrophobic atomic layer are continuously conducted. In the above, "continuously" refers to without breaking a vacuum, without interruption as a timeline, without changing treatment conditions, immediately thereafter, as a next step, or without a discrete physical or chemical boundary between two structures in some embodiments. In some embodiments, an inert gas and a reactant gas for forming the pore-sealing film are continuously and constantly supplied throughout the steps of forming the pore-sealing film and the hydrophobic atomic layer. In some embodiments, an inert gas and a reactant gas for forming the pore-sealing film are not supplied during the step of forming the hydrophobic atomic layer. The above embodiments can also be applied to use of a silicon-containing film other than the pore-sealing film.

The silicon-containing film, on a surface of which the hydrophobic atomic layer is formed, need not be a pore-sealing film but can be any suitable film which is benefited by hydrophobization of its surface. For example, the silicon-containing film is a low-k film with or without a pore-sealing film.

In some embodiments, the treating gas has a single Si—N bond and at least one Si-A bond in its molecule where A represents H or CxHy (x and y represent integers). For chemisorption of the treating gas, one Si—N bond is sufficient. A Si—N bond is easily subjected to substitution reaction with an OH group. If the treating gas has two or more Si—N bonds, a Si—N bond or Si—N bonds which is/are not used for or do/does not contribute to chemisorption remain(s) on the surface of the hydrophobic atomic layer. The remaining Si—N bond(s) contribute(s) to moisture adsorption on the surface of the hydrophobic atomic layer. The Si-A bond renders the surface hydrophobic, and a Si—CH$_3$ bond provides greater hydrophobic effect than a Si—H bond. In some embodiments, the treating gas has a single Si—N bond, and at least one Si—CxHy bond (e.g., two, three, or four Si—CxHy bonds such as S—CH$_3$ bonds), and need not have a Si—H bond.

In some embodiments, the treating gas is a gas constituted by at least one compound selected from the group consisting of dimethylaminotrimethylsilane (DMATMS), isopropylaminotrimethylsilane, dimethylaminotrimethylsilane, dimethylaminotriethylsilane, 2-picolylaminotrimethylsilane, hexamethyldisilazane (HMDS), and tetramethyldisilazane (TMDS).

In some embodiments, the silicon-containing film has a pore-sealing film formed as a top layer, and the step of providing the substrate comprises a step of depositing the pore-sealing film by plasma-enhanced atomic layer deposition (PEALD). In some embodiments, the pore-sealing film is deposited using a silicon-containing gas which is identical to the treating gas. In some embodiments, the pore-sealing film is deposited using an oxygen plasma. In some embodiments, the oxygen plasma is generated by supplying a gas containing oxygen and applying RF power to the gas. In some embodiments, the thickness of the pore-sealing film is in a range of about 0.5 nm to about 1.5 nm, depending on the pore size. When the pore size is about 1 nm, e.g., a k-value is about 2.3, a pore-sealing film having a thickness of about 0.5 nm to about 1.5 nm can effectively function as a chemical diffusion-blocking layer, whereas when the pore size is about 3 nm, e.g., a k-value is about 2.0, a pore-sealing film having a thickness of about 1.0 nm to about 1.5 nm can effectively function as a chemical diffusion-blocking layer. In some embodiments, the pore-sealing film is constituted by SiO, and in other embodiments, the pore-sealing film is constituted by SiOC.

In some embodiments, the silicon-containing film is a low-k film which has been damaged in processes. Such process-related damage of a low-k film may be any damage caused by processing the low-k film, such as plasma ashing, plasma etching, wet and dry cleaning, etc., resulting in a substantial increase of dielectric constant of a low-k film such as SiO, SiCO, SiN, SiCN, SiC, or other silicon-based multi-element materials. The "substantial increase" refers to at least 10%, 20%, or 30%, in some embodiments. Typically, the damaged surface of the low-k film develops numerous pores, and is terminated by OH groups. The low-k film includes, but is not limited to, low-k films constituted by SiO, or boron-based multi-element materials such as borozine, or multi-element hydrocarbon materials, etc., having a dielectric constant of about 1.9 to 5.0, typically about 2.1 to 3.0, preferably less than 2.5. In some embodiments, the low-k film is formed in trenches or holes including side walls and bottom surfaces, and/or flat surfaces, by plasma-enhanced CVD, thermal CVD, cyclic CVD, plasma-enhanced ALD, thermal ALD, radical-enhanced ALD, or any other thin film deposition methods. Typically, the thickness of the low-k film is in a range of about 50 nm to about 500 nm (a desired film thickness can be selected as deemed appropriate according to the application and purpose of film, etc.).

In some embodiments, the low-k film is a porous low-k film or extreme low-k film (ELK film) having properties shown in Table 1 below.

TABLE 1

| Porous low-k film properties | |
| --- | --- |
| Dielectric Constant (k) | ≤2.3 |
| Refractive Index (at 633 nm) | ≤1.40 |
| Porosity (%) | ≥30% |
| Pore Diameter (nm) | ≤1 nm |
| Elastic Modulus (GPa) | ≤6.5 GPa |

In some embodiments, a pore-sealing film is formed by ALD on the low-k film to alleviate the process-related damage. For example, in the pore-sealing step, the pore-sealing conditions shown in Table 2 are used. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle.

TABLE 2

| (the numbers are approximate) Pore-sealing conditions | |
| --- | --- |
| Substrate temperature | 25 to 500° C. (preferably 50 to 400° C.) |
| Pressure | 50 to 1300 Pa (preferably 100 to 800 Pa) |
| Reactant | O$_2$, NO$_2$, CO$_2$ |

TABLE 2-continued (the numbers are approximate)
Pore-sealing conditions

| | |
|---|---|
| Flow rate of reactant (continuous) | 100 to 5000 sccm (preferably 200 to 1000 sccm) |
| Dilution gas (rare gas) | He, Ar |
| Flow rate of dilution gas (continuous) | 50 to 3000 sccm (preferably 100 to 2000 sccm) |
| Precursor | dimethylaminotrimethylsilane (DMATMS), isopropylaminotrimethylsilane, dimethylaminotrimethylsilane, dimethylaminotriethylsilane, 2-picolylaminotrimethylsilane, hexamethyldisilazane (HMDS), and/or tetramethyldisilazane (TMDS) |
| Flow rate of precursor (including carrier gas) | 10 to 2000 sccm (preferably 10 to 500 sccm) |
| Precursor pulse (supply time of the gas) | 0.1 to 3 sec (preferably 0.1 to 1 sec) |
| Purge upon the precursor pulse | 0.5 to 10 sec (preferably 0.5 to 5 sec) |
| RF power (13.56 MHz) for a 300 mm wafer | 20 to 10 W (preferably 30 to 70 W) |
| RF power pulse | 0.1 to 3 sec (preferably 0.3 to 1 sec) |
| Purge upon the RF power pulse | 0 to 3 sec (preferably 0 to 0.5 sec) |
| Number of cycles repeated | 3 to 20 (preferably 5 to 10) for pore size of 1 nm; 8 to 30 (preferably 10 to 20) for pore size of 3 nm |
| Thickness of film | 0.5 to 1 nm (preferably 1 to 2 nm) |

In some embodiments, a hydrophobic atomic layer is formed by ALD on the pore-sealing film or other low-k film to further alleviating the process-related damage. For example, in the surface-hydrophobization step (i.e., the hydrophobic atomic layer deposition step), the conditions shown in Table 3 are used. Since ALD is a self-limiting adsorption reaction process, the number of deposited precursor molecules is determined by the number of reactive surface sites (OH groups) and is independent of the precursor exposure after saturation, and a supply of the precursor is such that the reactive surface sites are saturated by one cycle.

TABLE 3

(the numbers are approximate)
Surface-hydrophobization conditions

| | |
|---|---|
| Precursor | dimethylaminotrimethylsilane (DMATMS), isopropylaminotrimethylsilane, dimethylaminotrimethylsilane, dimethylaminotriethylsilane, 2-picolylaminotrimethylsilane, hexamethyldisilazane (HMDS), and/or tetramethyldisilazane (TMDS) |
| Flow rate of precursor (including carrier gas) | 2 to 900 sccm (preferably 4 to 200 sccm, e.g., 10 to 100 sccm) |
| Precursor pulse (supply time of the gas) | 0.1 to 600 sec (preferably 1 to 300 sec, e.g., 30 to 120 sec) |
| Purge upon the precursor pulse | 0.5 to 600 sec (preferably 1 to 300 sec, e.g., 30 to 120 sec) |

The other conditions which are not indicated above but are necessary for surface-hydrophobization, such as temperature and pressure, can be unchanged from those shown in Table 2 (note that the hydrophobic atomic layer deposition does not use RF power). The supply of the precursor need not be controlled based on the flow rate, but can be controlled by gas pressure control based on vapor pressure of the precursor. When the vapor pressure of the precursor is low, the flow is adjusted by controlling the temperature such that the vapor pressure can be set at 100 Pa or higher, whereas when the vapor pressure of the precursor is high, an orifice is provided downstream of a bottle (containing a mixture of liquid and vapor of the precursor) to reduce the flow. Accordingly, the flow rate, supply time, and purge are modified. A skilled artisan can readily operate the ALD process based on the description disclosed herein as a matter of routine work.

In the surface-hydrophobization step, as long as the partial pressure of the precursor can be maintained in the reaction chamber, gases such as a reactant and a dilution gas or the like need not be supplied, although such an additional gas can be supplied for operational reasons (e.g., a reactant and a dilution gas can be continuously supplied as shown in Table 2 throughout the hydrophobic atomic layer deposition step for avoiding pressure fluctuation).

Figure 2:
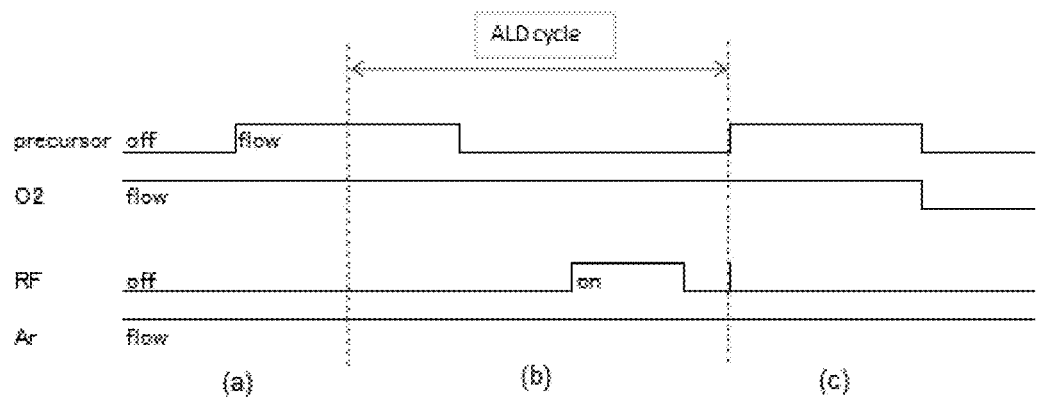
FIG. 2 illustrates a process sequence of a pore-sealing cycle and a surface-hydrophobization step according to an embodiment of the present invention.

FIG. 2 illustrates a process sequence of a pore-sealing cycle and a surface-hydrophobization step according to an embodiment of the present invention. Period (a) is an initial step where a reactant gas (e.g., $O_2$) and a dilution gas (e.g., Ar) are supplied to a reaction chamber, and then, a precursor is supplied to the reaction chamber before period (b) starts, so that a surface of a wafer is fully saturated with the precursor. Period (b) is a pore-sealing film deposition cycle by ALD where the reactant gas and the dilution gas are continuously supplied to the reaction chamber, and the precursor is also supplied in a pulse, followed by purging of the reaction chamber to remove a non-adsorbed precursor from the surface of a substrate, and then, RF power is applied in a pulse to the reaction chamber to generate a plasma (an oxygen plasma in this sequence) to fix the adsorbed precursor on the substrate, thereby forming a fixed monolayer on the substrate, followed by purging of the reaction chamber to remove a non-reacted product from the surface of the substrate. This cycle is repeated until a pore-sealing film with a desired thickness is achieved. During the purging step, the reactant gas and the dilution gas function as a purge gas. Alternatively, a different purge gas can be supplied in a pulse for purging. Period (c) is a hydrophobization step where the reactant gas and the dilution gas are continuously supplied to avoid pressure fluctuation in the reaction chamber, and the precursor is supplied in a pulse so as to adsorb the precursor on the substrate, thereby forming an unfixed or chemisorbed monolayer, followed by purging of the reaction chamber by the dilution gas to remove a non-chemisorbed precursor from the surface of the substrate. In period (c), no RF power or other means for exciting the monolayer is applied, and the chemisorbed monolayer remains unfixed and constitutes an uppermost layer which is exposed to the atmosphere or a moisture-containing environment, i.e., period (c) is conducted once as the last step of the deposition process of the pore-sealing film. In some embodiments, period (c) is conducted more than once (e.g., twice) in order to ensure that a complete, continuous monolayer without significant holes is formed by chemisorption.

Figure 3:
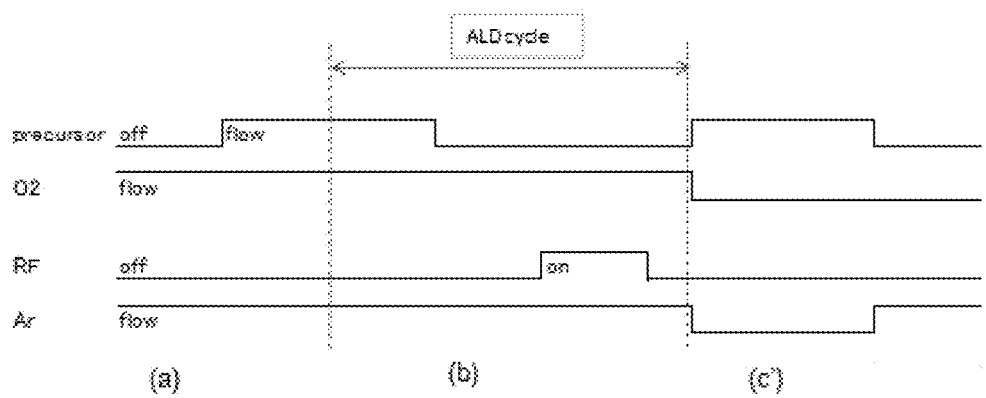
FIG. 3 illustrates a process sequence of a pore-sealing cycle and a surface-hydrophobization step according to another embodiment of the present invention.

FIG. 3 illustrates a process sequence of a pore-sealing cycle and a surface-hydrophobization step according to another embodiment of the present invention. This sequence is the same as the sequence illustrated in FIG. 2 except that while supplying the precursor in period (c), no reactant gas or no dilution gas is supplied. Since a reactant gas and a dilution gas do not contribute to chemisorption of the precursor to form a hydrophobic atomic layer, these gases can be stopped while supplying the precursor in period (c), followed by purging of the reaction chamber by the dilution gas to remove a non-chemisorbed precursor from the surface of the substrate.

Figure 4:
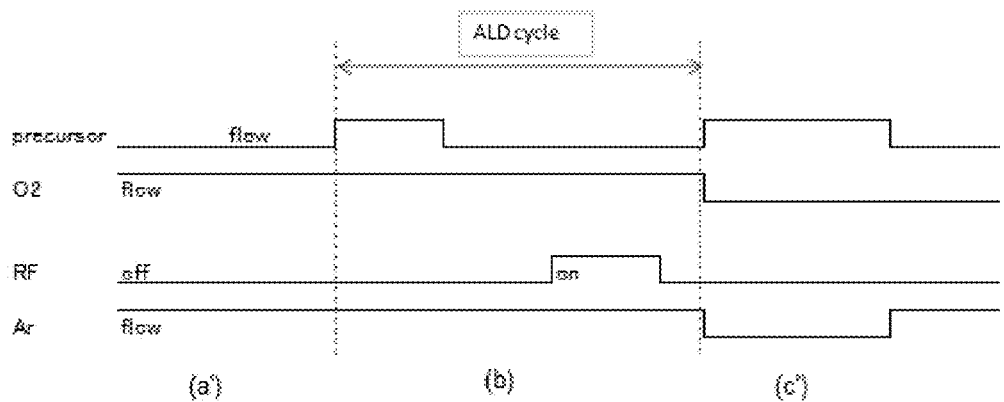
FIG. 4 illustrates a process sequence of a pore-sealing cycle and a surface-hydrophobization step according to still another embodiment of the present invention.

FIG. 4 illustrates a process sequence of a pore-sealing cycle and a surface-hydrophobization step according to still another embodiment of the present invention. This sequence is the same as the sequence illustrated in FIG. 3 except that in period (a), no precursor is supplied. The prolonged or extended supply of the precursor only in the first cycle in period (b) as illustrated in FIG. 3 (i.e., the supply of the precursor begins before period (b) starts) can ensure that sufficient chemisorption occurs from the first cycle, but need not be conducted.

In some embodiments, the reactant gas can be supplied only when RF power is applied in period (b).

In some embodiments, the precursor used in period (b) and the precursor used in period (c) are different. However, if both precursors have a single Si—N bond and at least one Si—H or Si—CxHy bond, the k-value can be recovered more significantly than in the case where only the precursor used in period (c) has a single Si—N bond and at least one Si—H or Si—CxHy bond, since OH groups can be removed not only from the surface but also from the inside of pores. In some embodiments, period (b) and period (c) are performed discontinuously in the same chamber or in different reaction chambers. However, it is preferable to continuously conduct the two periods and keep as many process conditions unchanged as possible, for simpler operation. Further, it is preferable to treat the exposed surface with a hydrophobic atomic layer in period (c) before the exposed surface is exposed to the atmosphere or moisture-containing environment.

In some embodiments, by the surface-hydrophobization step, the k-value of the silicon-containing film which has been damaged can be recovered to the original k-value of the silicon-containing film (which original k-value is a value before being damaged) or a k-value substantially close to the original k-value (e.g., an increase can be controlled within about 5% or less or about 10% or less of the original k-value).

In another aspect of the present invention, a method for repairing process-related damage of a silicon-containing dielectric film formed on a substrate caused by processing the dielectric film comprises: (i) providing the silicon-containing dielectric film damaged by the processing of the dielectric film; (ii) forming a pore-sealing film on a surface of the damaged dielectric film by plasma-assisted deposition, said pore-sealing film being constituted by SiO or SiOC; and (iii) forming a hydrophobic atomic layer on a surface of the pore-sealing film by exposing the surface to a silicon-containing treating gas without exciting the gas so as to chemisorb the gas on the surface, wherein the dielectric film has a first dielectric constant (k1) before the processing, the damaged dielectric film has a second dielectric constant (k2), the pore-sealed dielectric film has a third dielectric constant (k3), and the surface-hydrophobization treated dielectric film has a fourth dielectric constant (k4), wherein k1≤k4<k3<k2, and a recovery rate ((k2−k4)/(k2−k1)×100) is more than 50%, e.g., 60% to 90%, and an intermediate recovery rate ((k3−k4)/(k3−k1)×100) is up to 50%, e.g., 20% to 50%. In the above, the dielectric constant is a dielectric constant of the dielectric film provided with, in any, a pore-sealing film and a hydrophobic atomic layer. For example, the thickness of the dielectric film is about 200 nm, the thickness of the pore-sealing film is about 1 nm, and the thickness of the hydrophobic atomic layer is about 0.5 nm, and thus, the dielectric constant of the pore-sealing film alone (e.g., k=about 4) does not affect the total dielectric constant of the dielectric film with the pore-sealing film. In some embodiments, the pore-sealing film and the hydrophobic atomic layer can be any of those disclosed herein. In some embodiments, there is no intervening chemical treatment step such as a surface-oxidization step between steps (ii) and (iii).

In some embodiments, in step (ii), the plasma-assisted deposition is plasma enhanced atomic layer deposition (PEALD) using a silicon-containing gas having a single Si—N bond and at least one Si-A bond in its molecule where A represents H or CxHy (x and y represent integers). In some embodiments, the silicon-containing gas in step (ii) is the same as the treating gas in step (iii). Initially, a SiO or SiOC film by PEALD was believed to be unsuitable as a pore-sealing film because it may further damage the underlying dielectric film. However, by forming a hydrophobic atomic layer thereon (especially when the SiO or SiOC pore-sealing film is formed using a single Si—N bond and at least one Si-A bond in its molecule where A represents H or CxHy (x and y represent integers)), the process-related damage can effectively be recovered. The SiO or SiOC pore-sealing film has advantages such as high deposition rate (e.g., 0.06 to 0.1 nm/cycle) and high conformality (at least 85%) as compared with a SiN pore-sealing film.

In the present disclosure where conditions and/or structures are not specified, the skilled artisan in the art can readily provide such conditions and/or structures, in view of the present disclosure, as a matter of routine experimentation. Also, in the present disclosure, the numerical values applied in specific embodiments can be modified by a range of at least ±50% in other embodiments, and the ranges applied in embodiments may include or exclude the endpoints.

EXAMPLES

FIG. 1 is a schematic representation of a PEALD apparatus for depositing a pore-sealing film on a dielectric film usable in an embodiment of the present invention. In this example, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz-500 kHz) (not shown) to one side, and electrically grounding the other side, a plasma is excited between the electrodes. A temperature regulator is provided in a lower stage 2 (the lower electrode), and a temperature of a substrate placed thereon is kept constant at a given temperature. The upper electrode 4 serves as a shower plate as well, and a precursor gas is introduced into the reaction chamber 3 through a gas flow line 23, a pulse flow control valve 31, and the shower plate 4, whereas a rare gas is introduced into the reaction chamber 3 through a gas flow line 21 and the shower plate 4. A line for introducing a reactant gas is omitted (since the precursor is not reactive to an oxidizing gas without excitation, an oxidizing gas can be supplied concurrently with the precursor). Additionally, in the reaction chamber 3, an exhaust pipe 6 is provided, through which gas in the interior 11 of the reaction chamber 3 is exhausted using a pressure control valve 16 connected to a vacuum pump 17. Additionally, the reaction chamber is provided with a seal gas flow controller (not shown) to introduce seal gas into the interior 11 of the reaction chamber 3 (a separation plate 15 for separating a reaction zone and a transfer zone in the interior of the reaction chamber is provided).

In the examples, the apparatus shown in the schematic diagram of FIG. 1 was used to form a film. Note that the present invention is not at all limited to the apparatus shown in this figure and any other apparatus can be used so long as it can perform PEALD.

Comparative Example 1

1) A Si substrate (300 mm in diameter with patterns having an aspect ratio of about 4 with a width of about 80 nm) was placed in the reactor and a Sloane polymer film was formed on the substrate using Aurora® X (diethoxymethylsilane; ASM International N.V.) and Pore Builder™ (hydrocarbon for atom transfer radical polymerization; ASM International N.V.), He, and $O_2$. The substrate with the siloxane polymer film was transferred to a UV reactor and subjected to UV cure, thereby obtaining an ELK film having a dielectric constant of 2.3.

2) Next, the substrate with the ELK film was transferred to a reactor for plasma ashing or etching under the conditions shown in Table 4 below, thereby causing plasma damage to the ELK film. As a result of the plasma damage, the dielectric constant of the ELK film increased to 3.0.

TABLE 4

(the numbers are approximate)
Damage conditions

| | |
|---|---|
| RF frequency | 13.56 MHz |
| HRF | 60 W |
| Treatment time | 24 sec |
| Substrate temperature | 250° C. |
| Pressure | 466 Pa |
| He | 2000 sccm |
| $O_2$ | 12 sccm |
| Gap between electrodes | 8 mm |

3) Next, the substrate with the damaged ELK film was transferred to the reactor illustrated in FIG. 1 for pore-sealing using bisdiethylaminosilane (BDEAS) under the conditions shown in Table 5 below using the process sequence illustrated in FIG. 2 (except that no hydrophobization step was performed), thereby obtaining a pore-sealed ELK film.

TABLE 5

(the numbers are approximate)
Pore-sealing conditions

| | |
|---|---|
| Substrate temperature | 170° C. |
| Pressure | 200 Pa |
| Reactant gas | $O_2$ |
| Flow rate of reactant gas (continuous) | 100 sccm |
| Dilution gas | Ar |
| Flow rate of dilution gas (continuous) | 500 sccm |
| Precursor | BDEAS |
| Precursor pulse (supply time) | 1 sec at 5 sccm |
| Purge upon precursor pulse | 1 sec |
| RF frequency | 13.56 MHz |
| RF power | 50 W |
| RF power pulse | 1 sec |
| Purge upon the RF power pulse | 0.5 sec |
| Number of cycles repeated | 10 |
| Thickness of pore-sealing film | 1 nm |

The film was evaluated after the film was exposed to the atmosphere, and the results are shown in Table 6. The pore-sealed ELK film did not recover the dielectric constant, and rendered the exposed surface highly hydrophilic as shown in Table 6. BDEAS has two Si—H bonds, but no Si—CxHy bond, and two Si—N bonds in its molecule.

The contact angle against water was measured as follows: a water drop (0.3 μml) was dropped on the surface of the substrate at room temperature (25° C.), and the angle of the drop relative to the surface of the substrate was measured based on a photograph taken in a horizontal direction. When the angle is 80° or higher, the surface is considered to be highly hydrophobic, whereas when the angle is 30° or lower, the surface is considered to be highly hydrophilic. The conformality was defined as a ratio of thickness of a film on a sidewall to thickness of a film on a top surface.

TABLE 6

(the numbers are approximate)

| | GPC (growth per cycle [nm]) | Conformality (step coverage) | Recovered k-value | Contact angle against water |
|---|---|---|---|---|
| Comparative Example 1 | 0.06 to 0.1 | 90% | 3.0 | 10° |

Example 1

In a manner substantially similar to that in Comparative Example 1, a damaged ELK film was prepared, which had a dielectric constant of 3.0. The damaged ELK was subjected to the pore-sealing cycles under the conditions shown in Table 7 using dimethylaminotrimethylsilane (DMATMS) to obtain a pore-sealed ELK film. Next, the pore-sealed ELK film was subjected continuously to a hydrophobization step in the reaction chamber under the conditions shown in Table 8 to treat the pore-sealed surface of the film with a hydrophobic atomic layer. The process sequence illustrated in FIG. 2 was used herein.

TABLE 7

(the numbers are approximate)
Pore-sealing conditions

| | |
|---|---|
| Substrate temperature | 250° C. |
| Pressure | 200 Pa |
| Reactant gas | $O_2$ |
| Flow rate of reactant gas (continuous) | 30 sccm |
| Dilution gas | Ar |
| Flow rate of dilution gas (continuous) | 500 sccm |
| Precursor | DMATMS |
| Precursor pulse (supply time) | 1 sec at 100 sccm |
| Purge upon precursor pulse | 3 sec |
| RF frequency | 13.56 MHz |
| RF power | 50 W |
| RF power pulse | 1 sec |
| Purge upon the RF power pulse | 1 sec |
| Number of cycles repeated | 10 |
| Thickness of pore-sealing film | 1 nm |

TABLE 8

(the numbers are approximate)
Hydrophobization conditions

| | |
|---|---|
| Precursor | DMATMS |
| Precursor supply time | 120 sec at 100 sccm |
| Purge upon precursor supply | 30 sec |

The conditions for the pore-sealing, such as temperature and precursor flow rate, were slightly different from those in Comparative Example 1 because the flow of the precursor was controlled based on the pressure, and the vapor pressure of the precursor in Example 1 was different from that in Comparative Example 1. In Table 8, the supply time and flow rate of the precursor were significantly extended to ensure that the surface of the pore-sealed film was saturated with the chemisorbed precursor. However, the supply time and flow rate of the precursor can be significantly shorter as long as the surface of the pore-sealed film can be saturated with the chemisorbed precursor.

The film was evaluated after the film was exposed to the atmosphere, and the results are shown in Table 9. The pore-sealed ELK film with the hydrophobic atomic layer significantly recovered the dielectric constant, and rendered the exposed surface highly hydrophobic as shown in Table 9. DMATMS has one Si—N bond and three Si—CxHy bonds in its molecule. The surface-treated ELK film can continuously block moisture adsorption and maintain the recovered k-value, even when the surface is exposed to the atmosphere.

TABLE 9

(the numbers are approximate)

| | GPC (growth per cycle [nm]) | Conformality (step coverage) | Recovered k-value | Contact angle against water |
|---|---|---|---|---|
| Example 1 | 0.06 to 0.1 | 90% | 2.4 | 90° |

Example 2 and Comparative Examples 2, 3, and 4

In a manner substantially similar to that in Comparative Example 1 and Example 1, a damaged ELK film was prepared, which had a dielectric constant of 2.8 or 2.7 (the k-value before being damaged was 2.3). The damaged ELK was subjected to the pore-sealing cycles under the conditions shown in Table 10 using dimethylaminotrimethylsilane (DMATMS) for Comparative Example 2 and Example 2, and bisdiethylaminosilane (BDEAS) for Comparative Examples 3 and 4 to each obtain a pore-sealed ELK film. Next, the pore-sealed ELK film was subjected continuously to a surface-treating step in the reaction chamber under the conditions shown in Table 11 to treat the pore-sealed surface of the film.

TABLE 10

(the numbers are approximate)
Pore-sealing conditions

| | |
|---|---|
| Substrate temperature | 50° C. |
| Pressure | 200 Pa |
| Reactant gas | $O_2$ |
| Flow rate of reactant gas (continuous) | 30 sccm |
| Dilution gas | Ar |
| Flow rate of dilution gas (continuous) | 500 sccm |
| Precursor | DMATMS or BDEAS |
| Precursor pulse (supply time) | 1 sec at 100 sccm for DMATMS, at 5 sccm for BDEAS |
| Purge upon precursor pulse | 3 sec |
| RF frequency | 13.56 MHz |
| RF power | 50 W |
| RF power pulse | 0.5 sec |
| Purge upon the RF power pulse | 0.5 sec |
| Number of cycles repeated | 10 |
| Thickness of pore-sealing film | 1 nm |

TABLE 11

(the numbers are approximate)

| | Comparative Example 2 | Example 2 | Comparative Example 3 | Comparative Example 4 |
|---|---|---|---|---|
| Precursor | DMATMS | DMATMS | BDEAS | BDEAS |
| Precursor supply time | 100 sec at 5 sccm | 120 sec at 100 sccm | 100 sec at 5 sccm | 120 sec at 100 sccm |
| Purge upon precursor supply | 3 sec | 30 sec | 3 sec | 30 sec |
| RF power | 50 W | None | 50 W | None |
| RF power pulse | 1 sec | None | 1 sec | None |

The surface treatment step in each Comparative Examples 2 and 3 was the extension of the pore-sealing step, i.e., an additional cycle of the pore-sealing step was repeated, and no separate surface treatment step was conducted.

Each film was evaluated after the film was exposed to the atmosphere, and the results are shown in Table 12. The pore-sealed ELK film with the hydrophobic atomic layer formed from DMATMS in Example 2 remarkably recovered the dielectric constant (the recovery rate was 80%), and rendered the exposed surface highly hydrophobic (a contact angle was 90°) as shown in Table 12. In contrast, the pore-sealed ELK film with the atomic layer formed from BDEAS in Comparative Example 4 did not significantly recover the dielectric constant (the recovery rate was 20%), and the exposed surface was rendered hydrophilic (the contact angle was 45°) as shown Table 12. Further, the pore-sealed ELK film without a separate surface treatment step in Comparative Example 2 moderately recovered the dielectric constant (the recovery rate was 40%), but the exposed surface was rendered highly hydrophilic (the contact angle was 10°) as shown in Table 12, even though the precursor was the same as in Example 2 (i.e., DMATMS). That is, when the atomic layer was unfixed, i.e., a chemisorbed monolayer, the surface could be rendered highly hydrophobic, and when the atomic layer was fixed, even if the same treating gas was used, the surface could not be rendered hydrophobic, and the k-value recovery was not satisfactory. This is because when a SiO film is formed by ALD as the pore-sealing film was formed in the above examples, the ALD includes an oxidization cycle where the surface constituted by SiOC is oxidized, i.e., generating OH groups on the surface and contributing to an increase of a k-value. In Example 2 or other embodiments, although the ALD includes an oxidization cycle to form a pore-sealing film, thereby generating OH groups on the surface, the subsequent hydrophobization step can replace OH groups with, e.g., $CH_3$ groups via the chemisorption process without excitation, thereby alleviating the process-related damage. In Comparative Example 3, since no separate surface treatment step was conducted and BDEAS was used as the treating gas, the k-value was not recovered (the recovery rate was 0%), and the surface was highly hydrophilic (the contact angle was 10°). In Comparative Example 2, because DMATMS was used to form the pore-sealing film, Si—$CH_3$ groups present in DMATMS could remain inside the pores, contributing removal of OH groups from the pores. Thus, the recovery rate (40%) in Comparative Example 2 was significantly better than that (0%) in Comparative Example 3, although the surfaces of both films were hydrophilic (the contact angle was 10°) since no hydrophobization was performed.

TABLE 12

|  | Treating gas | Damaged k-value | Recovered k-value | Recovery rate | Contact angle |
|---|---|---|---|---|---|
| Comparative Example 2 | DMATMS | 2.8 | 2.6 | 40% | 10° |
| Example 2 | DMATMS | 2.8 | 2.4 | 80% | 90° |
| Comparative Example 3 | BDEAS | 2.8 | 2.8 | 0% | 10° |
| Comparative Example 4 | BDEAS | 2.7 | 2.6 | 20% | 45° |

Example 3

Figure 5:
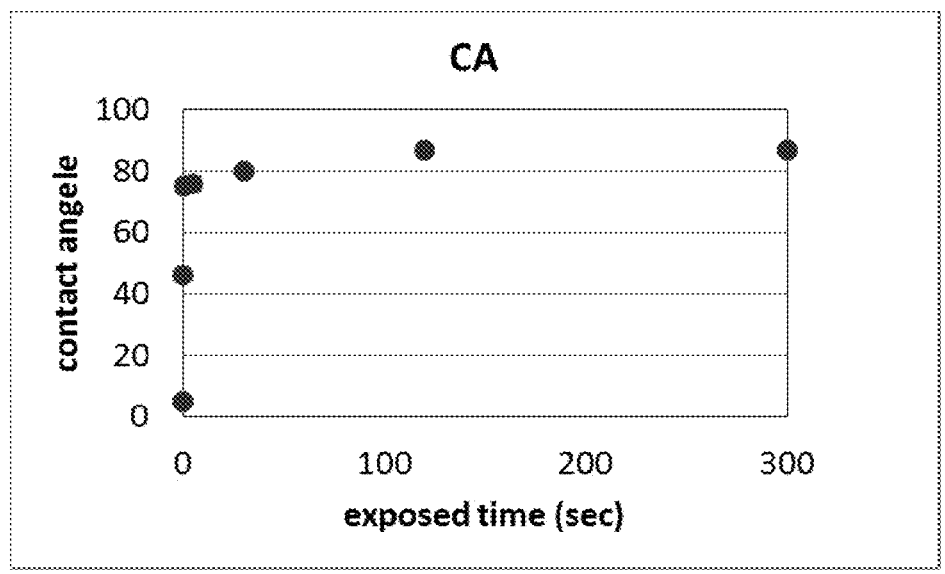
FIG. 5 is a graph showing the relationship between contact angle (°) and exposed time (sec) according to embodiments of the present invention.

In a manner substantially similar to that in Example 1, a pore-sealed ELK film was prepared and subjected continuously to a surface-treating step (hydrophobization step) in the reaction chamber under conditions which were the same as in Example 1 except that the gas-exposure time (precursor supply time) varied from 0 sec to 300 sec (i.e., 0, 0.1, 0.5, 1.0, 30, 120, and 300 sec). The contact angle of each resultant treated surface is shown in FIG. 5. As shown in FIG. 5, the contact angle was drastically changed toward a hydrophobic state at a gas-exposure time of 0.5 sec, and the contact angle reached 80° at a gas-exposure time of 30 sec, i.e., rendering the surface hydrophobic. Thereafter, the contact angle appeared to reach a plateau in a range of 80° to 90°.

Examples 4 and 5

In a manner substantially similar to that in Example 2, a damaged ELK film was prepared, and the damaged ELK was subjected to the pore-sealing cycles (the number of cycles was changed as shown in Table 13), and then, the pore-sealed ELK film was subjected continuously to the surface hydrophobization step in the reaction chamber. The ELK film in Example 4 had an original k-value of 2.3 and a pore size of about 1 nm, and the ELK film in Example 5 had an original k-value of 2.0 and a pore size of about 3 nm. The ELK films in Examples 4 and 5 were subjected to a chemical diffusion test where the substrate was submerged in a liquid chemical (ethanol) for 5 minutes, and then a cross section of the substrate was observed to see if the chemical penetrated through the surface and diffused toward the inside the substrate. The results are shown in Table 13.

TABLE 13

|  | Original k-value (pore size) | Thickness of pore-sealing film (the number of ALD cycles) | | | |
|---|---|---|---|---|---|
|  |  | 0 nm (0 cycles) | 0.5 nm (5 cycles) | 1 nm (10 cycles) | 1.5 nm (15 cycles) |
| Example 4 | 2.3 (1 nm) | x | ○ | ○ | ○ |
| Example 5 | 2.0 (3 nm) | x | x | ○ | — |

The symbol "x" represents that diffusion was observed, and the symbol "○" represents that no diffusion was observed. The thickness of the pore-sealing film was a thickness of a pore-sealing film which was formed on a flat Si surface under the same conditions. As shown in Table 13, the surface of the substrate having a pore size of about 1 nm (with a k-value of 2.3) was successfully sealed by a pore-sealing film having a thickness of 0.5 nm or higher, whereas the surface of the substrate having a pore size of about 3 nm (with a k-value of 2.0) was successfully sealed by a pore-sealing film having a thickness of 1.0 nm or higher.

Example 6

In this example, the substrate having the pore-sealing film having a thickness of 1 nm, prepared in Example 4, was subjected to further film deposition where a TiN film was deposited by ALD as a barrier film on top of the substrate. Thereafter, the substrate was analyzed to see if Ti was diffused and migrated into the low-k film using Backside SIMS (Secondary Ion Mass Spectrometry). It was confirmed that no Ti diffusion was detected in the low-k film, indicating that the pore-sealing film functioned as a pore-sealing film which effectively blocked migration of Ti into the low-k film.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for repairing process-related damage of a silicon-containing dielectric film formed on a substrate caused by processing the dielectric film comprises:
    (i) providing the silicon-containing dielectric film damaged by the processing of the dielectric film;
    (ii) forming a pore-sealing film on a surface of the damaged dielectric film by plasma-assisted deposition, said pore-sealing film being constituted by SiO or SiOC and deposited using an oxygen-containing plasma; and
    (iii) forming a hydrophobic atomic layer on a surface of the pore-sealing film by exposing the surface to a silicon-containing treating gas without exciting the gas throughout step (iii) so as to chemisorb the gas on the surface, wherein steps (ii) and (iii) are continuously conducted without interruption in sequence,
    wherein the dielectric film has a first dielectric constant (k1) before the processing, the damaged dielectric film has a second dielectric constant (k2), the pore-sealed dielectric film has a third dielectric constant (k3), and the surface-hydrophobization treated dielectric film has a fourth dielectric constant (k4), wherein k1≤k4<k3<k2;
    wherein a recovery rate ((k2−k4)/(k2−k1)×100) is more than 50%, and an intermediate recovery rate ((k3−k4)/(k3−k1)×100) is no more than 50%;
    wherein the treating gas has a single Si—N bond and at least one Si—CxHy (x and y represent integers); and
    wherein the hydrophobic atomic layer has a contact angle against water of about 80° or higher.

2. The method according to claim 1, wherein in step (ii), the plasma-assisted deposition is plasma enhanced atomic layer deposition (PEALD) using a silicon-containing gas having a single Si—N bond and at least one Si-A bond in its molecule where A represents H or CxHy (x and y represent integers).

3. The method according to claim 1, wherein the silicon-containing gas in step (ii) is the same as the treating gas in step (iii).

4. The method according to claim 1, wherein the oxygen-containing plasma in step (ii) is an oxygen plasma.

5. The method according to claim 4, wherein an inert gas and an oxygen gas are continuously and constantly supplied throughout steps (ii) and (iii).

6. The method according to claim 4, wherein an inert gas and an oxygen gas are not supplied during step (iii).

* * * * *